United States Patent [19]
Horton et al.

[11] Patent Number: 5,768,770
[45] Date of Patent: Jun. 23, 1998

[54] ELECTRONIC PACKAGING SHAPED BEAM LEAD FABRICATION

[76] Inventors: Raymond Robert Horton, 106 Ridge Rd., Dover Plains, N.Y. 12522; Alphonso Philip Lanzetta, 194 Reservoir Rd., Marlboro, N.Y. 12542; Ismail Cevdet Noyan, 1235 Main St., Peekskill, N.Y. 10566; Michael Jon Palmer, RD2, Box 372, Walden, N.Y. 12586

[21] Appl. No.: 477,074

[22] Filed: Jun. 7, 1995

Related U.S. Application Data

[62] Division of Ser. No. 994,096, Dec. 18, 1992, which is a continuation of Ser. No. 638,487, Jan. 4, 1991, abandoned.

[51] Int. Cl.$^6$ .................................................. H01R 43/00
[52] U.S. Cl. .................................. 29/827; 29/843; 29/874
[58] Field of Search ............................ 29/827, 843, 874; 174/52.1, 52.4; 257/666, 676, 692–696, 735; 361/772, 773, 774, 776; 439/68, 83, 330, 525

[56] References Cited

U.S. PATENT DOCUMENTS

| | | | |
|---|---|---|---|
| 4,125,740 | 11/1978 | Paletto | 174/52 |
| 4,618,879 | 10/1986 | Mizukoshi et al. | 357/74 |
| 4,866,504 | 9/1989 | Landis | 357/68 |
| 5,117,275 | 5/1992 | Bregman et al. | 357/70 |

FOREIGN PATENT DOCUMENTS

| | | |
|---|---|---|
| 60-103652 | 7/1985 | Japan . |
| 61-13654 | 1/1986 | Japan . |
| 62-166643 | 10/1987 | Japan . |
| 63-43430 | 3/1988 | Japan . |
| 2-65265 | 3/1990 | Japan . |

OTHER PUBLICATIONS

Microelectronics Packaging Handbook Edited by Rao R. Tummala and Eugene J. Rymaszewski, Van Nostrand (1989) pp. 409–431.

"Comparative Compliance of Representative Lead Designs for Surface Mounted Components" Robert W. Kotlowitz, 1989 Proceedings of the 39th Electronic Components Conference, pp. 791–831.

*Primary Examiner*—P. W. Echols
*Assistant Examiner*—Adrian L. Coley

[57] ABSTRACT

Process for shaping conductors critically spaced on a carrier that are bonded to contact locations on a substrate surface. The conductors are cantilevered with each adjacent conductor bonded to a contact location that is a different distance from the carrier. Each conductor remains in the plane of the support of the carrier to the vicinity of its respective contact location where it is shaped to extend nearly vertically toward the substrate then horizontally across the contact location exerting pressure on the contact location.

10 Claims, 2 Drawing Sheets

ELECTRONIC PACKAGING SHAPED BEAM LEAD FABRICATION

This application is a Division of application Ser. No. 07/994,096 Filed Dec. 18, 1992 which in turn is a continuation application of application Ser. No. 07/638,487 Filed Jan. 4, 1991, now abandoned.

FIELD OF THE INVENTION

The invention is in the field of the packaging of electronic apparatus and in particular to the providing of shaped beam lead conductors on a carrier bonded under close tolerances, to contact locations on a planar substrate.

BACKGROUND OF THE INVENTION

In the packaging of electronic devices, electrical signals are transferred from contact locations in very tightly packed portions of the packaging through a series of interfaces with conductor carriers to achieve progressively increased spacing for external connection. The tightly packed portions of the overall packaging are fabricated in planar substrate structures wherein highly precise planar processes are employed. The substrate structure may be a semiconductor integrated circuit with connection locations on the surface thereof, or a wiring module such as a buried conductor multilevel ceramic or a dielectric laminate that provides further interconnection to device terminals. The contact locations in the planar substrate surface are joined at an interface with precisely spaced conductors mounted on a carrier, that is generally a lamination or a plurality of laminations of dielectric material. The conductors on the carrier are fabricated and the bonding is conducted, using different type processes than those used with the substrate. The physical conditions at the interface must accommodate the considerations present in both carrier and the substrate structures. As illustrations of those considerations, with continued downsizing as the art requires greater packing densities, conductors are being placed on more than one plane in the carrier, the contact locations in the substrate structure planar surface are being placed over buried circuitry and the substrate structure materials themselves are becoming more fragile thus severely limiting pressure in the bonding operation, and the spacing of the conductors are becoming so close that electrochemical dendrite formation is an increasingly prevalent problem.

Efforts in the art heretofore to accommodate interface considerations have been by bending the conductors into different planes as illustrated in U.S. Pat. No. 4,125,740 and by the use of an intermediate fan-out interconnecting member on the same plane as illustrated in U.S. Pat. No. 4,866,504.

As the art continues to downsize and to involve different materials, a need is developing for a closer shaping match at the bonding interface.

SUMMARY OF THE INVENTION

The invention provides an interface where conductors supported by a carrier are joined to contact locations in a planar substrate surface through the use of cantilevered conductors where each adjacent conductor serves a contact location at a different distance from the carrier support and each conductor remains in the plane of support on the carrier to the vicinity of contact where the conductor is shaped to extend nearly vertically to and then horizontally across the respective contact location with pressure. The invention provides the principles of a tool with dimension controlling elements for use in shaping or forming the conductors.

DESCRIPTION OF THE INVENTION

Figure 1:
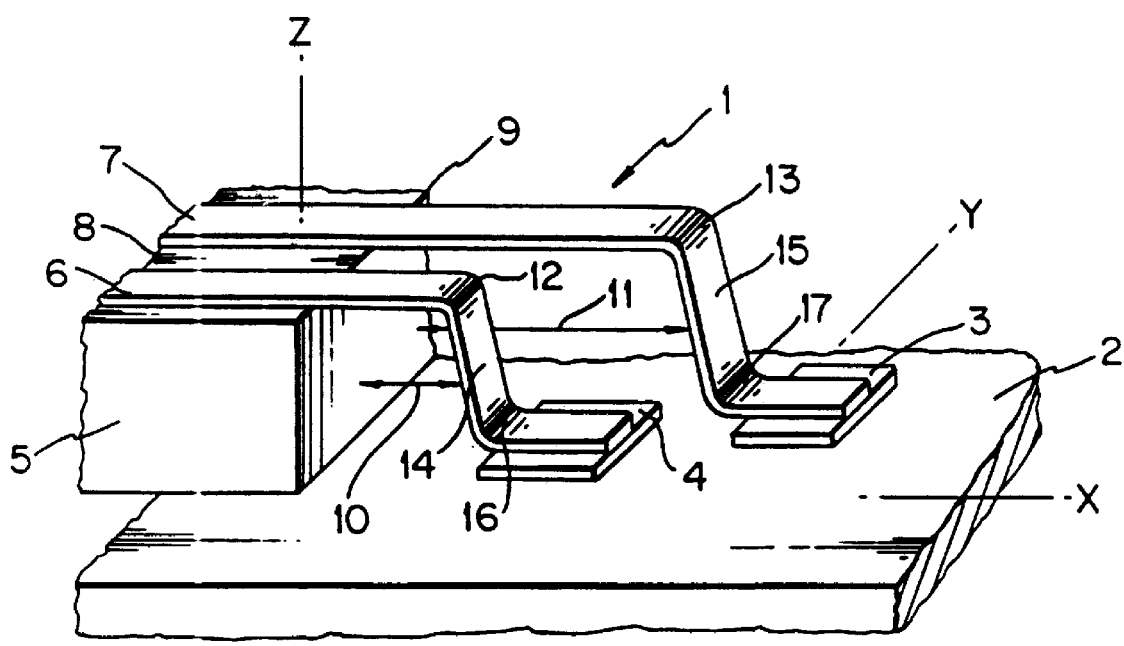
FIG. 1 is a schematic illustration of the invention.

Referring to FIG. 1 where the invention is schematically illustrated, the interface 1 is made up of a planar substrate surface 2 with contact locations 3 and 4 therein. A conductor carrier 5 is supporting conductors 6 and 7 separated by a designed, close proximity, space 8. The conductors 6 and 7 are cantilevered beyond the edge 9 of the supporting carrier 5 and have been cut initially to the correct length after shaping. They extend in the plane of support, maintaining the spacing 8, to the vicinity of the respective contact location for each conductor, which is 4 for conductor 6 and 3 for conductor 7. Each adjacent conductor is bonded to a contact location that is a different distance from the edge 9 in the substrate 2 surface. The combined features of each adjacent conductor being bonded a different distance from the edge 9 location in the substrate surface and the extending of the conductor in the plane of support to the vicinity of that location operates to assure that no two conductors in the region between the edge 9 and the bond at the contact location can come any closer than the designed proximity 8. Adjacent conductors 6 and 7 are each formed, a different distance 10 for conductor 6 and 11 for conductor 7, in the vicinity of the respective bonding area, 4 for conductor 6 and 3 for conductor 7. The forming of the conductors at those distances provides a change of direction approaching vertical, in other words, close to but not completely vertical, at a first radius locality, 12 for conductor 6 and 13 for conductor 7, a vertical length, 14 for conductor 6 and 15 for conductor 7, and, a second change of direction to horizontal at a second radius region, 16 for conductor 6 and 17 for conductor 7, with the remaining length of the conductor extending across the surface of the contact location to which it is bonded. The direction approaching but not quite vertical and the vertical dimension of each conductor, 14 for conductor 6 and 15 for conductor 7, in combination, is selected so that in assembly for bonding, when the conductors are in registration in x and y directions on their respective contact locations, a slight pressure in the z direction provides both contacting enhancement and a wiping action of the conductors on the contact location pads.

The invention makes possible the bonding of the conductors to very closely spaced contact location pads. In FIG. 1, the pads at locations 3 and 4 are shown as members of two parallel rows with respect to the carrier edge 9, one row farther separated from the edge 9, than the other. When the contact locations are closely spaced in the rows, the contact location pads in different rows will probably overlap along the line a conductor would follow from the edge 9 of carrier 5. The feature of the invention that keeps the conductor, in the plane of the support provided by carrier 5 to the vicinity of the contact location, facilitates contacting without shorting on other rows. That same feature also facilitates greater density in conductor spacing. The proximity dimension 8 is a designed size that is as small as can be tolerated within process and operational limitations. The sizes are becoming so small that electrolytic dendrite formation under operational voltages is becoming a limitation. The spacing of the conductors and the materials of the conductors are designed under given operating conditions to minimize the electrolytic dendrite formation. This invention preserves the design considerations at the interface by maintaining the designed separation to the vicinity of the bond at the contact location and unsupported conductor lengths that could come closer together or short are eliminated.

The invention, further, through the combined shape of the conductor features, of not being in the completely vertical direction, the specific length, 14 for conductor 6 and 15 for conductor 7, and, the change of direction to horizontal, 16 for conductor 6 and 17 for conductor 7, insures good bonding contact with a wiping action on the contact locations 3 and 4 that relaxes the bonding specifications and relaxes the location 3 and 4 height specifications. These relaxations in turn relax height and surface requirements on the contact locations 3 and 4 while also permitting less expensive processing including solder wave application of solder to the contact locations 3 and 4 rather than deposition through a mask and the use of other than thermocompression for the bonding of the conductors 6 and 7 to the locations 3 and 4.

The invention, still further, provides conductors that have improved compliance properties and thus the invention provides reduced strain on the bonds at the contact locations. The property of compliance of lead design is receiving attention in the art as illustrated by the article by R. W. Kotlowitz entitled "Comparative Compliance of Representative Lead Designs For Surface Mounted Components" in the 1989 39th Electronic Components Conference, pages 791–831.

Figure 2:
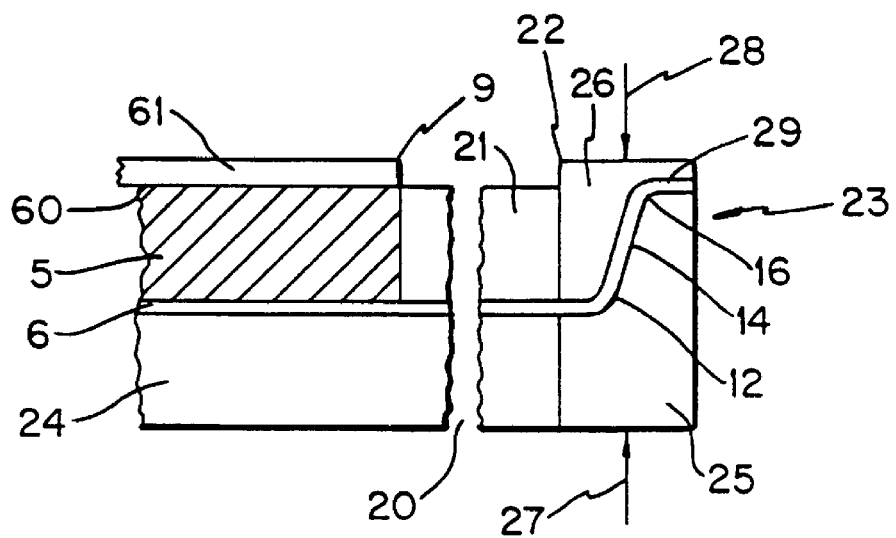
FIG. 2 is a schematic illustration of the principles of a tool for forming the conductor ends.

Referring next to FIG. 2, further, in accordance with the invention, a schematic illustration is provided of the principles employed in a tool for shaping the conductors. In FIG. 2, taking the portion of FIG. 1 including conductor 6 as an example, there is shown the carrier 5 with the conductor 6 supported to the edge 9 and extending cantilevered beyond. The carrier 5 is supported on the underside 60 by a support 61. The cantilevered portion of the conductor 6 is shown broken at 20 to indicate different distances to the vicinity of the particular contact location on the substrate to which it is to be bonded. In the case of the example conductor 6, the distance 10 in FIG. 1 is the distance of the support member 21 from the edge 9 to the edge 22 of the shaping die 23. The support member 21 is positioned in contact with the conductor 6 to prevent movement and possible detachment from the carrier 5 during shaping. An opposing support member 24 supports the conductor 6 across a portion of the carrier 5 to the edge 22 of the shaping die 23 to prevent movement and possible detachment from the carrier 5 during shaping. The shaping die 23 has opposing portions 25 and 26 that move toward each other as indicated by arrows 27 and 28 in the shaping operation. The two portions 25 and 26 of the shaping die 23 provide mating forces when moved together as indicated by arrows 27 and 28 so that, for conductor 6 the radius 12 at the vicinity of the contact location, the nearly vertical direction with length 14 to the radius 16 and the portion 29 that extends across the contact location 4, are formed.

It will be apparent to one skilled in the art, in the light of the principles described, that a number of fabrication variations will be involved with different carrier to substrate interface structures. As one example, where conductors are positioned on both sides of a carrier or at different levels in a multilaminar carrier, modifications in the supporting members will be needed to prevent movement at the carrier edge and during the forming operation. As another example, while individual elements are described for the support and die portions, since sizes are so small, an overall tool that forms all conductors at once, will employ common shaped material for support and shaping of each conductor. It is important in accordance with the invention that the cut to correct length cantilevered conductors, each adjacent conductor being assigned to a different distance from the carrier contact location, be supported in both toward the carrier and away from the carrier directions to the vicinity of the assigned contact location and that forming forces be provided at the end region of the conductor to bend the conductor nearly vertically toward the contact location and at the appropriate level to a horizontal direction across the contact location.

Best Mode of Carrying Out the Invention

The invention is very valuable in a carrier to substrate interface where the spacing between conductors is designed to be as small as process and operational limitations will permit. Such a condition occurs where the conductors are side by side on a single dielectric lamination type carrier such as a Tape Automated Bonding (TAB) tape and the contact locations on the substrate are in closely spaced rows with individual contact locations being wider than the separation between contact locations in an individual row.

In such a situation, at an interface where a conductor leaves the carrier and is unsupported to where it is bonded to the contact location, the unsupported length of conductor is free to move and can come closer to another conductor than the designed, minimum tolerable spacing.

Figure 3:
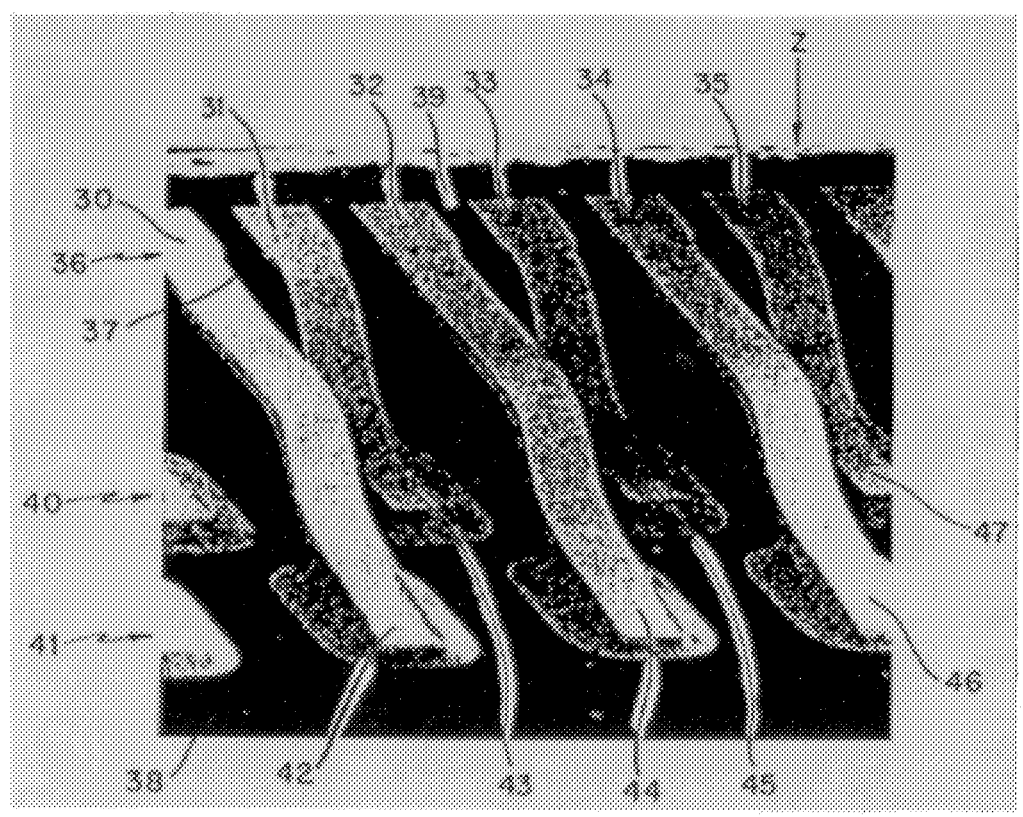
FIG. 3 is a photomicrograph of a preferred embodiment of the invention.

Referring to FIG. 3, a photomicrograph is provided of the best mode of the invention showing an interface illustrating the benefits of the invention. In FIG. 3, the conductors 30–35 that are completely visible are mounted side by side on a TAB type dielectric laminate carrier 36, and are cantilevered beyond the supporting edge 37. The underside of the carrier 36 is in contact with a substrate surface 38. The conductor to conductor spacing 39 is the minimum tolerable and the conductors between the supporting edge 37 and the contact locations to which they are bonded cannot be permitted to come closer than that spacing. In accordance with the invention, each conductor continues in the support plane from the carrier 36 edge 37 to the vicinity of the contact location to which it is to be bonded and those contact locations are assigned so that adjacent conductors are bonded to contact locations that are different distances from the carrier 36 edge 37. In FIG. 3, the contact locations are in two rows 40 and 41, with row 41 being a different and greater distance from carrier 36 edge 37 than row 40. Each contact location 42–47 is wider in the direction of the row than the separation between contacts in that row and the contact locations are staggered between rows which yields the maximum contact location area for the minimum overall substrate surface area used. The conductors 30 to 35 are bonded to contact locations 42 to 47, respectively, whereby each adjacent conductor on the carrier goes to a contact location that is a different distance on the substrate surface from the carrier 36 edge 37. Conductors 31, 33 and 35 change direction close to the carrier 36 edge 37 to the contact locations in row 40 whereas the conductor adjacent thereto, conductors 30, 32 and 34 continue in the plane of support to the vicinity of their respective contact locations in row 41. In the vicinity of the respective row the conductor is formed to a shape that bends nearly vertically toward the substrate in the vicinity of the row for a length slightly longer than the thickness of the carrier and then bends essentially horizontally across the contact location. The combined length and near vertical direction permits a small force in the direction labelled Z to produce a wiping action of all conductors on their respective contact locations at bonding. When the conductors are formed and bonded, no conductor can come closer to another than the designed side by side spacing on the carrier.

To provide a starting place for one skilled in the art in practicing the invention, the carrier 36 is of the order of 0.010 inches thick. The contact locations are in rows separated center to center approximately 0.050 inches with each location being approximately 0.020×0.020 inches. The contact locations are approximately 0.001 to 0.005 inches high depending on substrate processing. The conductors are formed to have a length approximately 0.011 approximately 20° off vertical. Under these conditions, reliable thermocompression and solder reflow bonds are achieved.

In accordance with the invention, the interface between carrier supported conductors and a substrate surface with contact locations is provided by the process of cutting the cantilevered conductors so that each has a length sufficient to permit each adjacent conductor to extend, after forming, to a location a different distance from the support edge of the carrier, bending all conductors so that each in the vicinity of its contact location is formed in a direction slightly off vertical toward the substrate for a length slightly greater than the height from the conductor on the carrier to the substrate and the conductor end in a horizontal direction across its contact location, applying a force to the carrier in the direction toward the substrate and providing a bonding heat cycle to each combination of conductor end and contact location.

What has been described is a structure, process and apparatus for providing a conductor interface between conductors critically spaced on a carrier, and contact locations in a planar substrate, wherein the conductors in the unsupported portion between the carrier and the bond at the contact location cannot come closer than the spacing on the carrier.

Having thus described our invention, what we claim as new and desire to secure by Letters Patent is:

1. The process of shaping conductors that are positioned with critical spacing on a first side of a dielectric carrier extending cantilevered from an edge of said carrier, that are to be bonded to contact locations on a substrate surface that are at different distances from an edge of said substrate, comprising in combination the steps of:
   supporting the second side of said carrier opposite to said first side with said conductors,
   preventing each said conductor from delaminating from said carrier at said edge of said carrier during bending of said conductor,
   bending the cantilevered end portion of each said cantilevered conductor in a first bend from said first side of said carrier toward said second side of said carrier for a distance slightly greater than the distance between said first and said second sides of said carrier, and in a second bend of the end of said conductor to a direction near parallel to the plane of said substrate, and,
   providing multiple separation distances from said edge of said carrier to the location of said first bend of said cantilevered conductors.

2. The process of claim 11 wherein said separation distances are provided by selected members positioned between said edge of said carrier and said first bend of said conductors.

3. The process of claim 2 wherein said separation distances are provided by alternate greater and lesser distance members.

4. The process of claim 3 wherein said bending step involves opposing mating members that move toward each other in producing bending.

5. The process of shaping conductors that are laminated to, supported by, and cantilevered from, a carrier edge, and each is to be bonded to a respective contact location in a substrate surface area, each adjacent contact location being a different distance from said carrier edge, comprising in combination the steps of:
   supporting each cantilevered conductor for protection from forces delaminating said conductor from said carrier during bending, the region of said supporting, extending from said carrier to the vicinity of each said contact location,
   cutting each cantilevered conductor to a length beyond said region sufficient for forming a first bend toward said substrate and a second bend to a direction parallel to said substrate for a distance comparable to a pad dimension in said substrate, and, bending each said cantilevered conductor at a first bend
   at a selected distance along each said cantilevered conductor at each said respective contact location in a direction toward said substrate in a slightly off vertical direction for a distance slightly greater than the height of said carrier at said edge and a second bend to a direction essentially parallel to said substrate.

6. The process of claim 5 including applying a force urging said carrier into contact with said substrate surface whereby each conductor contacts and wipes across each respective pad on said surface area.

7. The process of claim 6 including the step of applying a bonding heat cycle to each combination of a conductor and contact.

8. The process of claim 7 including in said bending step the step of applying opposing first and second bend forming forces perpendicular to said carrier edge from which each said conductor is cantilevered.

9. The process of forming conductors supported cantilevered from the edge of a carrier for bonding to contact locations in a substrate comprising in combination the steps of:
   cutting each conductor to a length different from any adjacent conductor, said length being sufficient for forming and bonding to an assigned contact location,
   bending all conductors so that each in the vicinity of the contact location to which it is assigned receives a first bend slightly off vertical toward said substrate for a length slightly greater than the height from the conductor on the carrier to said substrate and each receives a second bend to a horizontal direction essentially parallel to the assigned contact location,
   applying a force urging said carrier and said substrate toward each other when each said bent conductor is in contact with the assigned contact location therefor, and
   providing a bonding heat cycle to each combination of conductor end and contact location.

10. The process of claim 9 wherein said bending step is performed simultaneously on all conductors in a die.

* * * * *